United States Patent
Yasuda et al.

(10) Patent No.: US 9,238,275 B2
(45) Date of Patent: Jan. 19, 2016

(54) BRAZING METHOD AND BRAZED STRUCTURE

(75) Inventors: Keisuke Yasuda, Toyota (JP); Yuji Sugino, Nishio (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 293 days.

(21) Appl. No.: 13/882,861

(22) PCT Filed: Aug. 4, 2011

(86) PCT No.: PCT/JP2011/067843
§ 371 (c)(1),
(2), (4) Date: May 1, 2013

(87) PCT Pub. No.: WO2012/098720
PCT Pub. Date: Jul. 26, 2012

(65) Prior Publication Data
US 2013/0228322 A1  Sep. 5, 2013

(30) Foreign Application Priority Data

Jan. 20, 2011 (JP) ................................. 2011-009756

(51) Int. Cl.
*H01L 23/40* (2006.01)
*B23K 1/14* (2006.01)
(Continued)

(52) U.S. Cl.
CPC ............... *B23K 26/20* (2013.01); *B23K 1/0012* (2013.01);
(Continued)

(58) Field of Classification Search
CPC .... B23K 1/0012; B23K 1/0016; B23K 26/20; B23K 26/22; B23K 1/20; B23K 26/246; B23K 26/3206; B23K 2201/14; B23K 2201/42; F28F 3/00; F28F 3/12; H01L 23/3735; H01L 23/473; H01L 24/31; H01L 2224/32225; H05K 7/20254; H05K 7/20927; Y10T 29/49366; Y10T 29/49393
See application file for complete search history.

(56) References Cited

U.S. PATENT DOCUMENTS 3,214,564 A * 10/1965 Katzer et al. .................... 219/92
4,572,941 A *  2/1986 Sciaky et al. ............. 219/121.64
(Continued)

FOREIGN PATENT DOCUMENTS

CN   101730935 A   6/2010
JP   09-275170 A   10/1997
(Continued)

*Primary Examiner* — Alexander P Taousakis
(74) *Attorney, Agent, or Firm* — Kenyon & Kenyon LLP

(57) ABSTRACT

In this brazing method, which brazes an insulating substrate and a top plate that configure an HV inverter cooler, the insulating substrate is disposed on the top plate with a brazing material layer therebetween, and then, by means of laser irradiation, laser welding is performed at an arbitrary plurality of positions at the joining section between the top plate and the insulating substrate, thus provisionally affixing the insulating substrate to the top plate. Thereafter, by means of heating and melting the brazing material layer, the insulating substrate is brazed onto the top plate with the plurality of laser-welded positions as the brazing start points. After brazing, a power semiconductor is joined onto the insulating substrate corresponding to the center portion of the region surrounded by the plurality of brazing start points.

2 Claims, 14 Drawing Sheets

(51) Int. Cl.
*B23K 1/005* (2006.01)
*B23K 26/32* (2014.01)
*B23K 26/20* (2014.01)
*B23K 1/00* (2006.01)
*B23K 1/20* (2006.01)
*H01L 23/373* (2006.01)
*H01L 23/473* (2006.01)
*F28F 3/00* (2006.01)
*H05K 7/20* (2006.01)
*H01L 23/00* (2006.01)

(52) U.S. Cl.
CPC ............... *B23K 1/0016* (2013.01); *B23K 1/20* (2013.01); *B23K 26/244* (2015.10); *B23K 26/32* (2013.01); *F28F 3/00* (2013.01); *H01L 23/3735* (2013.01); *H01L 23/473* (2013.01); *H05K 7/20254* (2013.01); *H05K 7/20927* (2013.01); *B23K2201/14* (2013.01); *B23K 2201/42* (2013.01); *B23K 2203/50* (2015.10); *H01L 24/32* (2013.01); *H01L 2224/32225* (2013.01)

(56) References Cited

U.S. PATENT DOCUMENTS

| | | | |
|---|---|---|---|
| 2002/0139833 A1 | 10/2002 | Armstrong et al. | |
| 2003/0068532 A1 | 4/2003 | Tsukaguchi et al. | |
| 2009/0068446 A1* | 3/2009 | Bischof et al. | 428/336 |
| 2009/0283309 A1 | 11/2009 | Naba et al. | |
| 2012/0223430 A1 | 9/2012 | Terashima et al. | |
| 2014/0212208 A1* | 7/2014 | Schick et al. | 403/272 |
| 2015/0062839 A1* | 3/2015 | Merz et al. | 361/749 |

FOREIGN PATENT DOCUMENTS

| | | |
|---|---|---|
| JP | 2002-137974 A | 5/2002 |
| JP | 2003-112980 A | 4/2003 |
| JP | 2004-020016 A | 1/2004 |
| JP | 2005-224832 A | 8/2005 |
| JP | 2006-341304 A | 12/2006 |
| JP | 2007-222939 A | 9/2007 |
| JP | 2009-168361 A | 7/2009 |
| JP | 2010251443 A | 11/2011 |
| WO | 2008/004552 A1 | 1/2008 |
| WO | 2012/023440 A1 | 2/2012 |

* cited by examiner

BRAZING METHOD AND BRAZED STRUCTURE

This is a 371 national phase application of PCT/JP2011/067843 filed 4 Aug. 2011, claiming priority to Japanese Patent Application No. 2011-009756 filed 20 Jan. 2011, the contents of which are incorporated herein by reference.

TECHNICAL FIELD

The present invention relates to a brazing method and a brazed structure for brazing two components configuring a cooler of a hybrid inverter (an HV inverter).

BACKGROUND ART

Heretofore, as a technique in this field, a technique disclosed in Patent Document 1 indicated below has been known, for example. According to the technique, slits, lattices, or dimples forming multiple grooves are formed on an end face of a cooler so that a semiconductor is brazed to that end face. This configuration prevents generation of voids in brazed portions between the cooler and the semiconductor and also disperses stress applied to a brazing material, thereby preventing the occurrence of exfoliation and cracks in the brazed portions.

However, since the "slit" may impede flow of the brazing material, a brazing start point is required on every slit surface, and thereby not-bonded portions (voids) could be generated. Further, the "lattice" may also impede flow of the brazing material, requiring a brazing start point on every lattice surface, and thereby not-bonded portions (voids) could be generated. Furthermore, since the "dimple" is to be surface-brazed, high degree of flatness of a component is required, and that could cause cost increase.

RELATED ART DOCUMENTS

Patent Documents

Patent Document 1: JP09(1997)-275170A
Patent Document 2: JP2002-137974A

SUMMARY OF INVENTION

Problems to be Solved by the Invention

In the technique disclosed in the Patent Document 1, in brazing, warps could be generated on components due to high-temperature brazing, and thereby a gap in the bonded portion could be increased and flow of the brazing material could be impeded. Especially in brazing by a non-corrosive flux brazing method (NB method) under nitrogen atmosphere using a flux, residue of the flux is dispersed as voids, which could cause a decrease in bonding rate of the components. Further, if voids are irregularly generated in the bonded portion, a heat generating element fixed above the bonded portion cannot be efficiently cooled, leading to a fear of causing functional degradation of a cooler.

As a method for forming slits on an end face of a cooler, pressing and etching are conceivable. However, in pressing, a material of a recessed portion is pushed out to a plane part, and thereby a flatness of a component cannot be assured and a gap is generated to block flow of the brazing material, so that there is a possibility that brazing cannot be completed. While etching can assure the flatness of the component, cost is liable to be high.

The present invention has been made in view of the above circumstances and has a purpose of providing a brazing method and a brazed structure which can improve bonding efficiency of two components by controlling generating points of voids when brazing two components configuring a cooler.

Means of Solving the Problems (1) First aspect of the present invention to achieve the above-mentioned purpose provides a method for brazing a first member and a second member configuring a cooler of an HV inverter, wherein the method includes the steps of: placing the second member on the first member via a brazing material layer; subsequently, irradiating a laser beam for laser welding at arbitrary plural points of a bonded part between the first member and the second member to provisionally fix the second member to the first member; and thereafter, heating and melting the brazing material layer to braze the second member on the first member with a plurality of laser welded points as brazing start points.

According to the above configuration (1), the second member is brazed on the first member with the plurality of laser welded points as the brazing start points, and thereby it is possible to control void-generating points in the brazing material layer by arbitrarily setting a location of the brazing start points, i.e., laser irradiation points. In other words, since voids are liable to concentrate on a midpoint of the adjacent two brazing start points, it is possible to control the void generating points without the void being dispersed by setting the location of the brazing start points.

(2) To achieve the above purpose, in the configuration (1), preferably, after brazing, at least a heat generating element is bonded on the second member within a region surrounded by the plurality of brazing start points and above another brazing start point included in the region.

According to the configuration (2), in addition to the effect of the configuration (1), there are less residual voids in the brazing material layer within the region surrounded by the plurality of brazing start points and above another brazing start point included in that region. Accordingly, the heat generating element is bonded to the second member with avoiding the voids.

(3) To achieve the above purpose, in the above configuration (1), preferably, after brazing, at least a heat generating element is bonded on the second member in a position displaced from a central part of a region surrounded by the plurality of brazing start points toward the brazing start points or toward between the adjacent two brazing start points of the plurality of brazing start points so that the heat generating element is overlapped on the region.

According to the configuration (3), in addition to the effect of the configuration (1), there are less residual voids in the position displaced from the central part of the region surrounded by the plurality of brazing start points toward the brazing start points or toward between the two adjacent brazing start points of the plurality of brazing start points in the brazing material layer overlapped with the region. Accordingly, the heat generating element is bonded to the second member with avoiding the voids.

(4) To achieve the above purpose, second aspect of the present invention is to provide a brazed structure having a first member and a second member brazed together to configure a cooler of an HV inverter, wherein the second member is brazed on the first member via a brazing material layer, welded marks by laser welding remain at arbitrary plural points of a bonded part between the first member and the second member, and residual voids concentrate in between the adjacent welded marks in the brazing material layer.

According to the above configuration (4), the welded marks by laser welding remain at the arbitrary plural points of the bonded part between the first member and the second member, and the residual voids concentrate in between the adjacent welded marks in the brazing material layer. Thereby, the voids are less dispersed.

(5) To achieve the above purpose, in the above configuration (4), preferably, at least a heat generating element is bonded on the second member within a region surrounded by the plurality of welded marks and above another welded mark included in the region.

According to the above configuration (5), in addition to the effect of the configuration (4), there are less residual voids in the region surrounded by the plurality of welded marks and above another welded mark included in the region in the brazing material layer. Accordingly, the heat generating element is bonded to the second member with avoiding the voids.

(6) To achieve the above purpose, in the above configuration (4), preferably, at least a heat generating element is bonded on the second member in a position displaced from a central part of a region surrounded by the plurality of welded marks toward the welded marks or toward between the adjacent two welded marks of the plurality of welded marks so that the heat generating element is overlapped on the region.

According to the configuration (6), in addition to the effect of the configuration (4), there are less residual voids in the position displaced from the central part of the region surrounded by the plurality of welded marks toward the welded marks or toward between the adjacent two welded marks of the plurality of welded marks in the brazing material layer overlapped with the region. Accordingly, the heat generating element is bonded to the second member with avoiding the voids.

Effects of the Invention

According to the above configuration (1), in relation to brazing of two components configuring a cooler, bonding efficiency of the two components can be stabilized and improved by controlling void-generating portions.

According to the above configuration (2), in addition to the effect of the configuration (1), the heat generating element and the voids are hardly overlapped upon one another, and heat radiation from the heat generating element is less impeded by the voids, thus improving a function of a cooler that efficiently cools the heat generating element.

According to the above configuration (3), in addition to the effect of the configuration (1), the heat generating element and the voids are hardly overlapped upon one another, and heat radiation from the heat generating element is less impeded by the voids, thus improving a function of a cooler that efficiently cools the heat generating element.

According to the above configuration (4), in relation to brazing of two components configuring a cooler, bonding efficiency of the two components can be stabilized and improved by controlling void-generating portions.

According to the above configuration (5), in addition to the effect of the configuration (4), the heat generating element and the voids are hardly overlapped upon one another, and heat radiation from the heat generating element is less impeded by the voids, thus improving a function of a cooler that efficiently cools the heat generating element.

According to the above configuration (6), in addition to the effect of the configuration (4), the heat generating element and the voids are hardly overlapped upon one another, and heat radiation from the heat generating element is less impeded by the voids, thus improving a function of a cooler that efficiently cools the heat generating element.

MODE FOR CARRYING OUT THE INVENTION

First Embodiment

A first embodiment embodying "a brazing method and a brazed structure" of the present invention applied to a cooler of an HV inverter is explained in detail below with reference to the accompanying drawings.

Figure 1:
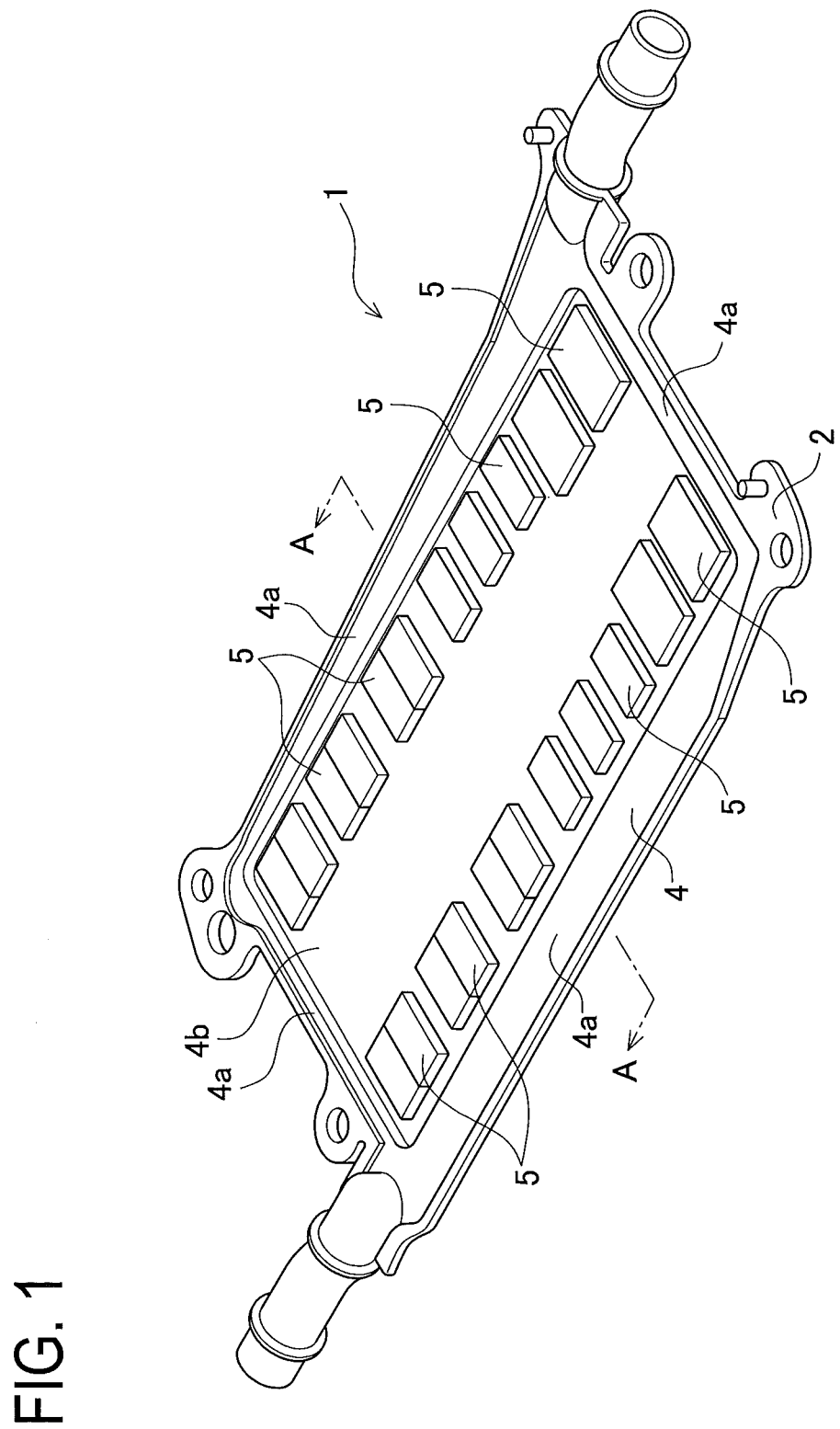
FIG. 1 is a perspective view of a cooler of an HV inverter in a first embodiment.
Figure 2:
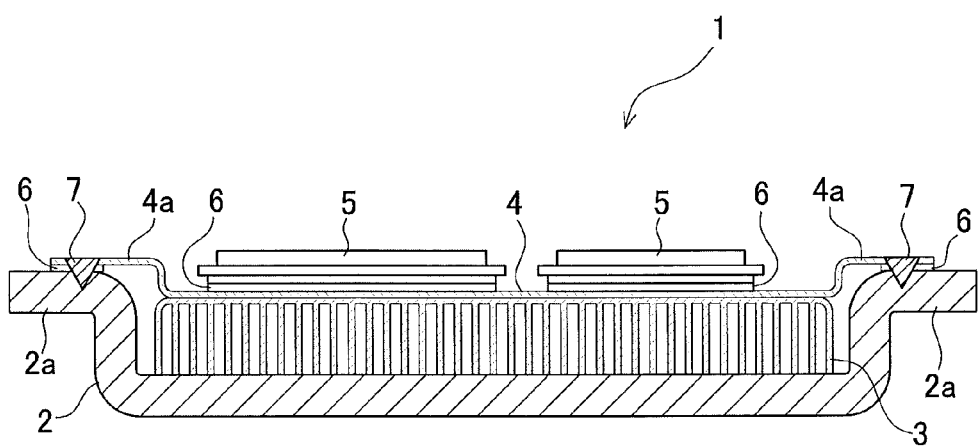
FIG. 2 is a sectional view showing a schematic configuration of the cooler, taken along a line A-A in FIG. 1 in the first embodiment.

FIG. 1 is a perspective view showing a cooler 1 of an HV inverter. FIG. 2 is a sectional view of a schematic configuration of this cooler 1, taken along a line A-A in FIG. 1. The cooler 1 includes a box-shaped case 2, a cooling fin 3 provided inside the case 2, a top plate 4 as a first member placed on the cooling fin 3, and a plurality of insulating substrates 5 as a second member placed on the top plate 4. The case 2 includes a flange 2 on its outer periphery. The top plate 4 is arranged to cover an upside of the cooling fin 3 and includes a flange 4a on its outer periphery. On each insulating substrate 5, a power semiconductor 9 (see FIG. 4) as a heat generating element is to be fixed.

As shown in FIG. 2, the flange 4a of the top plate 4 is set in place on and brazed to the flange 2a of the case 2. Specifically, the flange 4a of the top plate 4 and the flange 2a of the case 2 are bonded together via a brazing material layer 6. On bonded surfaces of the flange 4a of the top plate 4 and the flange 2a of the case 2, welded marks 7 by laser welding remain in several spots. These welded marks 7 are made by laser welding when the top plate 4 is provisionally fixed to the case 2 before brazing. In the present embodiment, a thickness of the flange 2a of the case 2 is "3.0 (mm)", a thickness of the flange 4a of the top plate 4 is "0.6 (mm)," a thickness of the brazing material layer 6 is "0.15 (mm)", and a diameter of each welded mark 7 is "1 to 2 (mm)."

Figure 3:
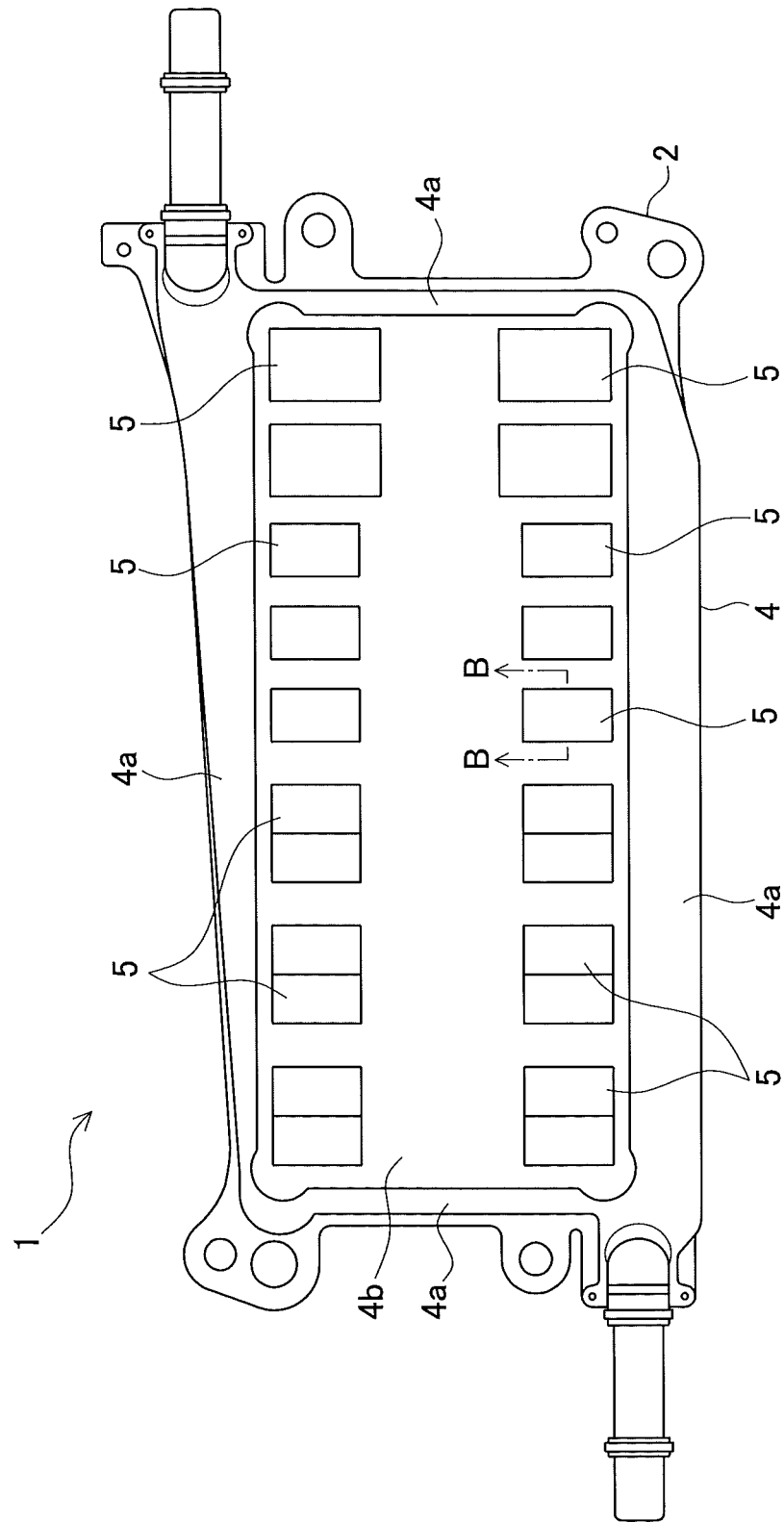
FIG. 3 is a plan view of the cooler in the first embodiment.
Figure 4:
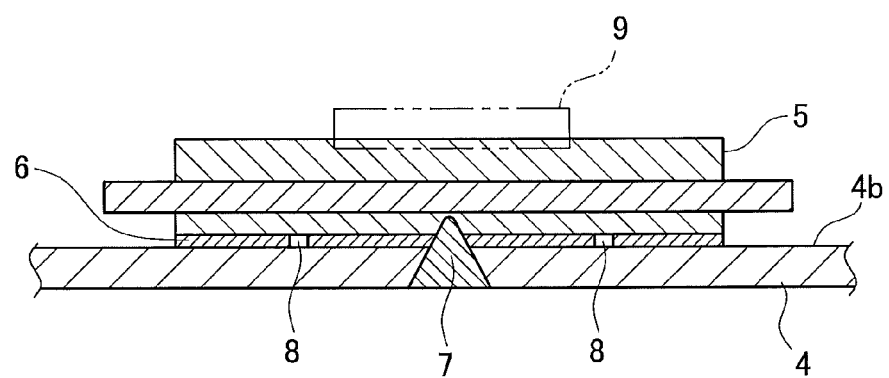
FIG. 4 is a sectional view showing a bonding relationship between a top plate and an insulating substrate, taken along a line B-B in FIG. 3 in the first embodiment.

FIG. 3 is a plan view of the cooler 1. FIG. 4 is a sectional view showing a relationship between the top plate 4 and the insulating substrate 5, taken along a line B-B in FIG. 3. As shown in FIG. 3, each insulating substrate 5 is arranged and brazed on a recessed part 4b of the top plate 4. Specifically, as shown in FIG. 4, the recessed part 4b of the top plate 4 and the insulating substrate 5 are bonded via a brazing material layer 6. Further, in a bonded part between the recessed part 4b of the top plate 4 and the insulating substrate 5, the welded mark 7 formed by laser welding remains at a predetermined point. This welded mark 7 is made by laser welding when the insulating substrate 5 is provisionally fixed to the recessed part 4b of the top plate 4 before brazing. Adjacent to the welded mark 7, voids 8 remain in the brazing material layer 6. In the present embodiment, a brazed structure of the present invention is applied to the above mentioned cooler 1.

Figure 5:
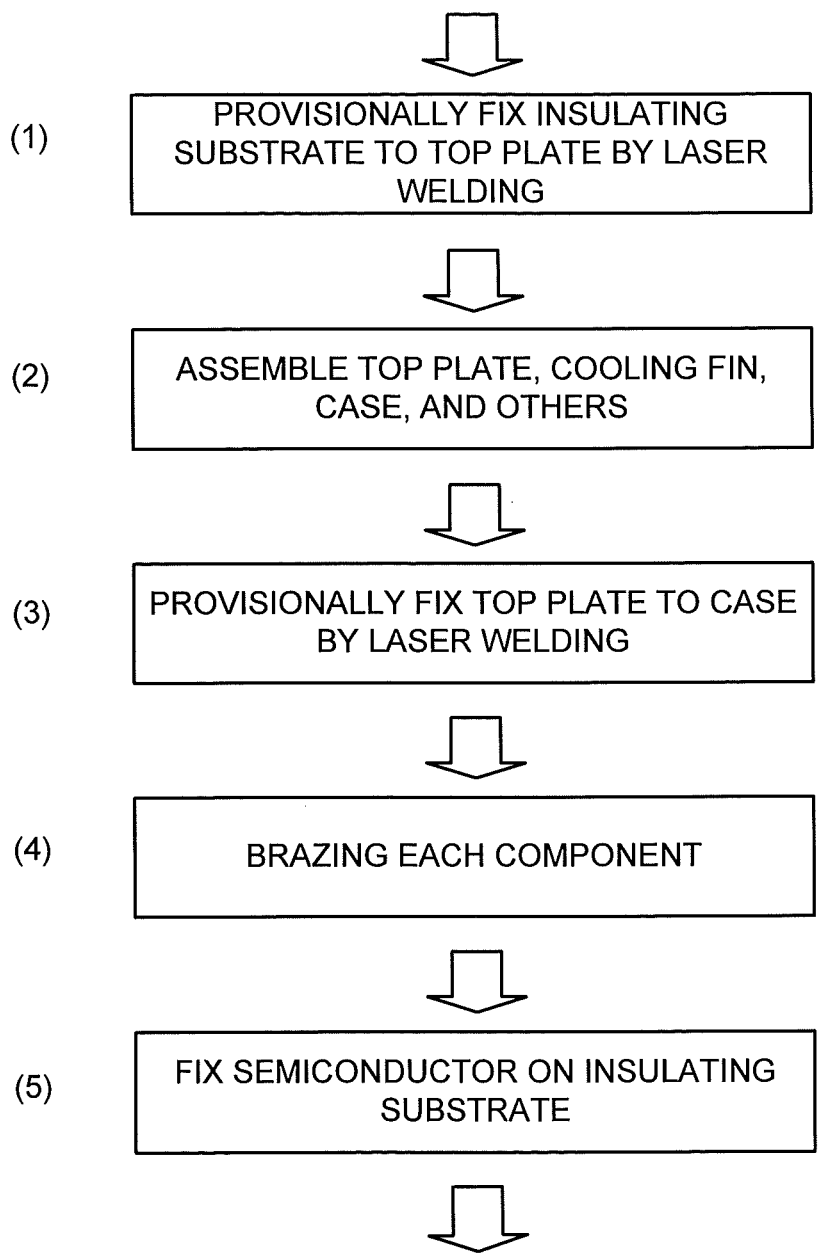
FIG. 5 is a flow chart showing steps of a brazing method in the first embodiment.

A brazing method relating to the above-described cooler 1 is now explained. FIG. 5 is a flow chart showing a process of the brazing method of the present embodiment.

Figure 6:
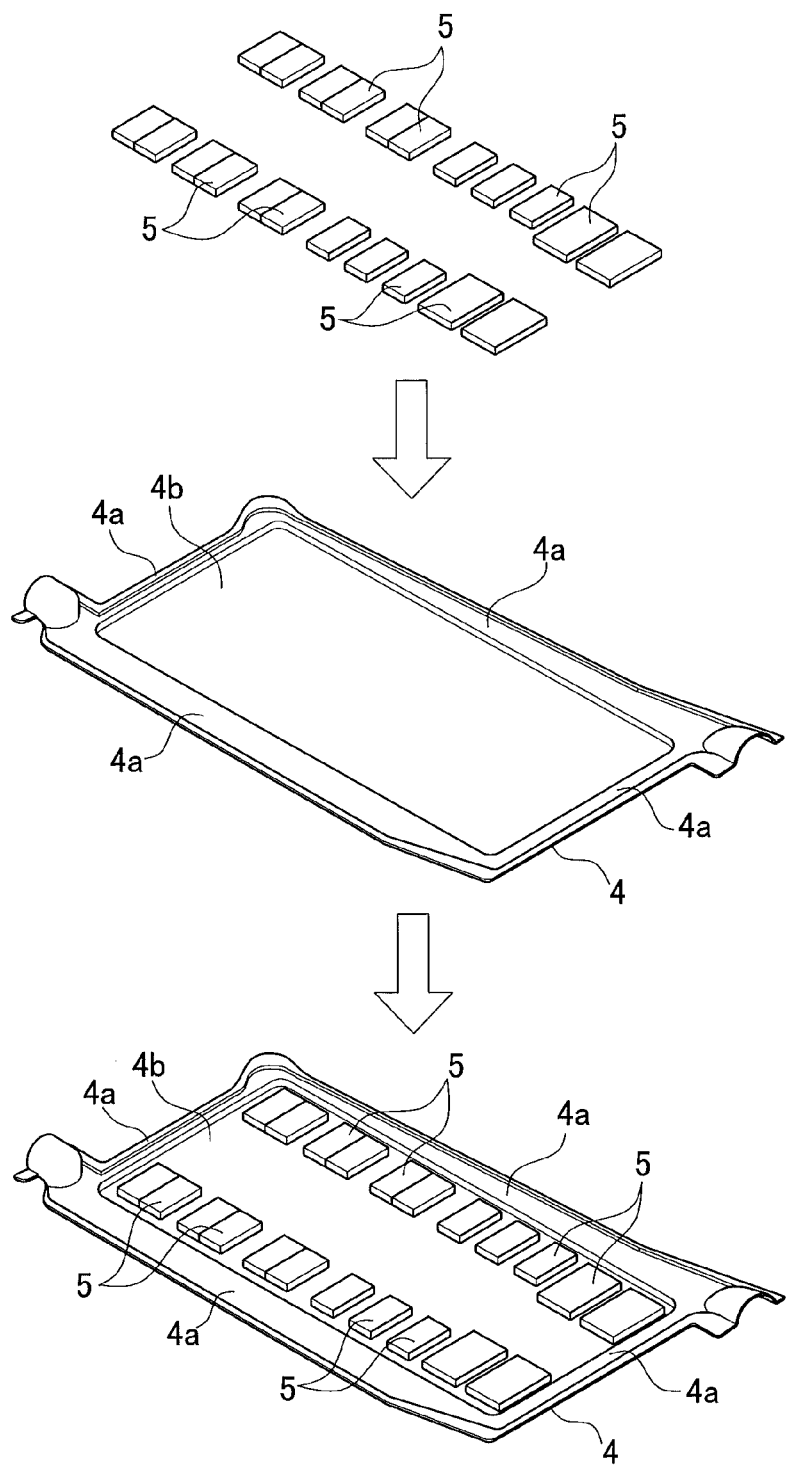
FIG. 6 is a perspective view showing a process of arranging a plurality of insulating substrates on the top plate in the first embodiment.
Figure 7:
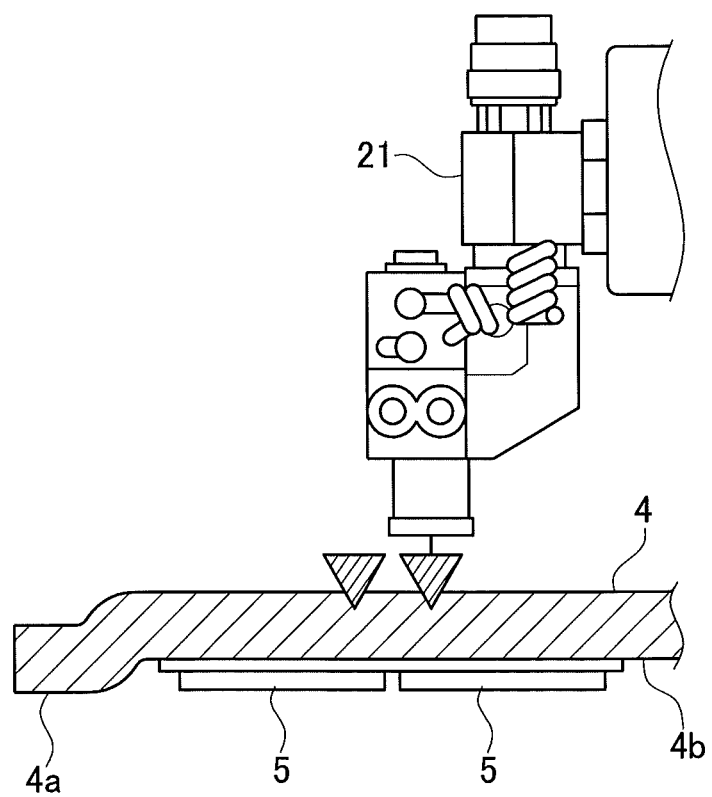
FIG. 7 is a sectional view showing a process of laser-welding the insulating substrate to the top plate in the first embodiment.

First, as indicated in (1) of FIG. 5, the plurality of insulating substrates 5 are provisionally fixed to the top plate 4 by laser welding. To be specific, as shown in a perspective view of FIG. 6, the plurality of insulating substrates 5 are placed on the recessed part 4b of the top plate 4 via the brazing material layers 6 (see FIGS. 2 and 4), and then as shown in a sectional view of FIG. 7, the insulating substrates 5 are laser-welded by, for example, a fiber laser device 21 from a rear side of the top plate 4 to be provisionally fixed to the top plate 4. In the present embodiment, laser irradiation is carried out with at least either one of the pulse number and the output of a laser beam adjusted by the fiber laser device 21. In the present embodiment, laser welding is made on each vertex and an intersection point of diagonal lines of the insulating substrate 5 of a rectangular shape in plan view so that five welded marks 7 in total are formed between the recessed part 4b of the top plate 4 and the insulating substrate 5 (see FIG. 11).

Figure 8:
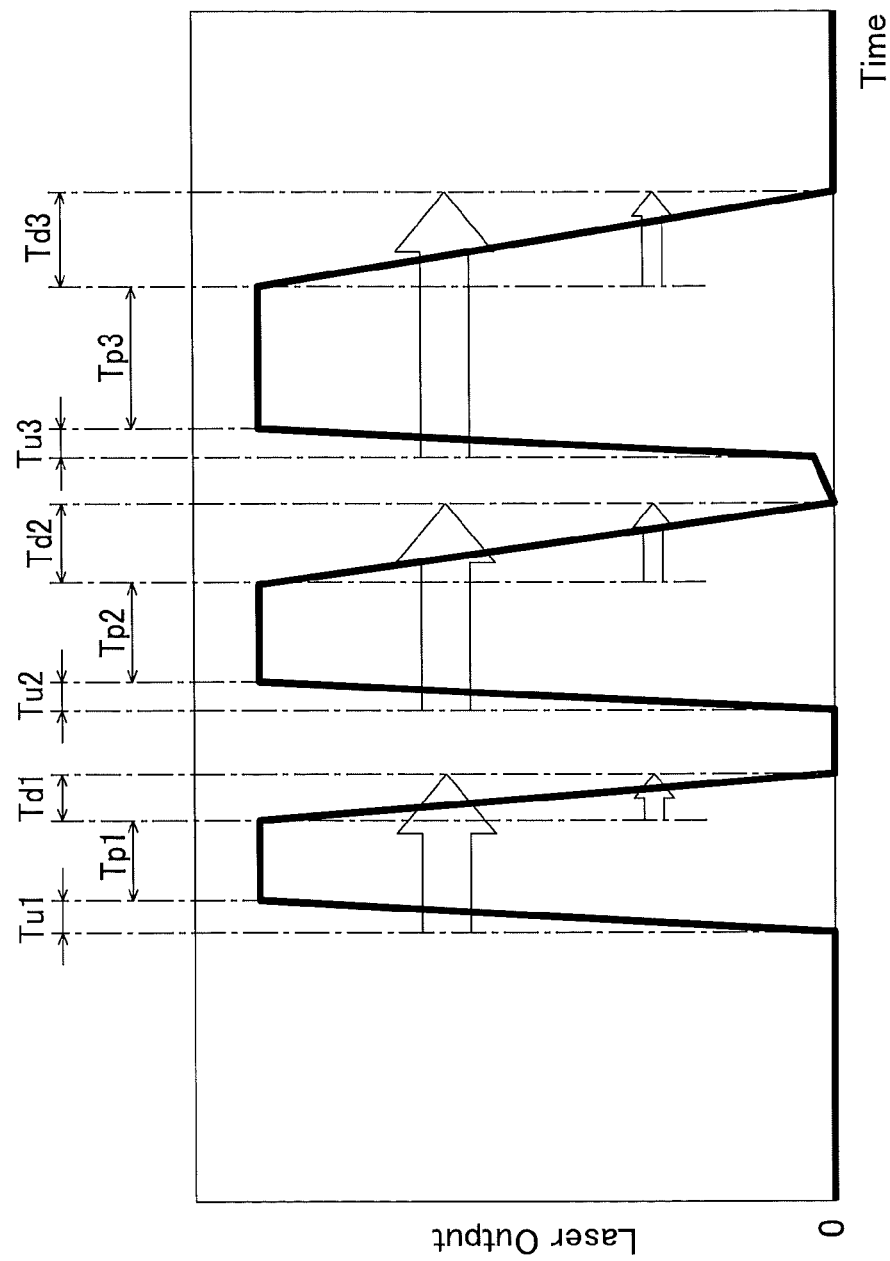
FIG. 8 is a graph showing a relationship between laser output and irradiation time in the first embodiment.

FIG. 8 is a graph showing a relationship between the laser output and irradiation time. As shown in FIG. 8, the laser beam is irradiated by three separate pulses in the present embodiment. In those pulse outputs, their rising times Tu1, Tu2, and Tu3 are equal to each other, and then, peak times Tp1, Tp2, and Tp3 are controlled and falling times Td1, Td2, and Td3 are controlled. Namely, the irradiation time of each pulse output is determined by adding the variable peak times Tp1 to Tp3 and the variable falling times Td1 to Td3 to the rising times Tu1 to Tu3, respectively. In the present embodiment, the pulse number of laser, the irradiation time of each pulse output, or the peak output of laser is controlled to adjust the total laser output to be applied to a certain point. With this output adjustment, the laser beam is irradiated.

Figure 9:
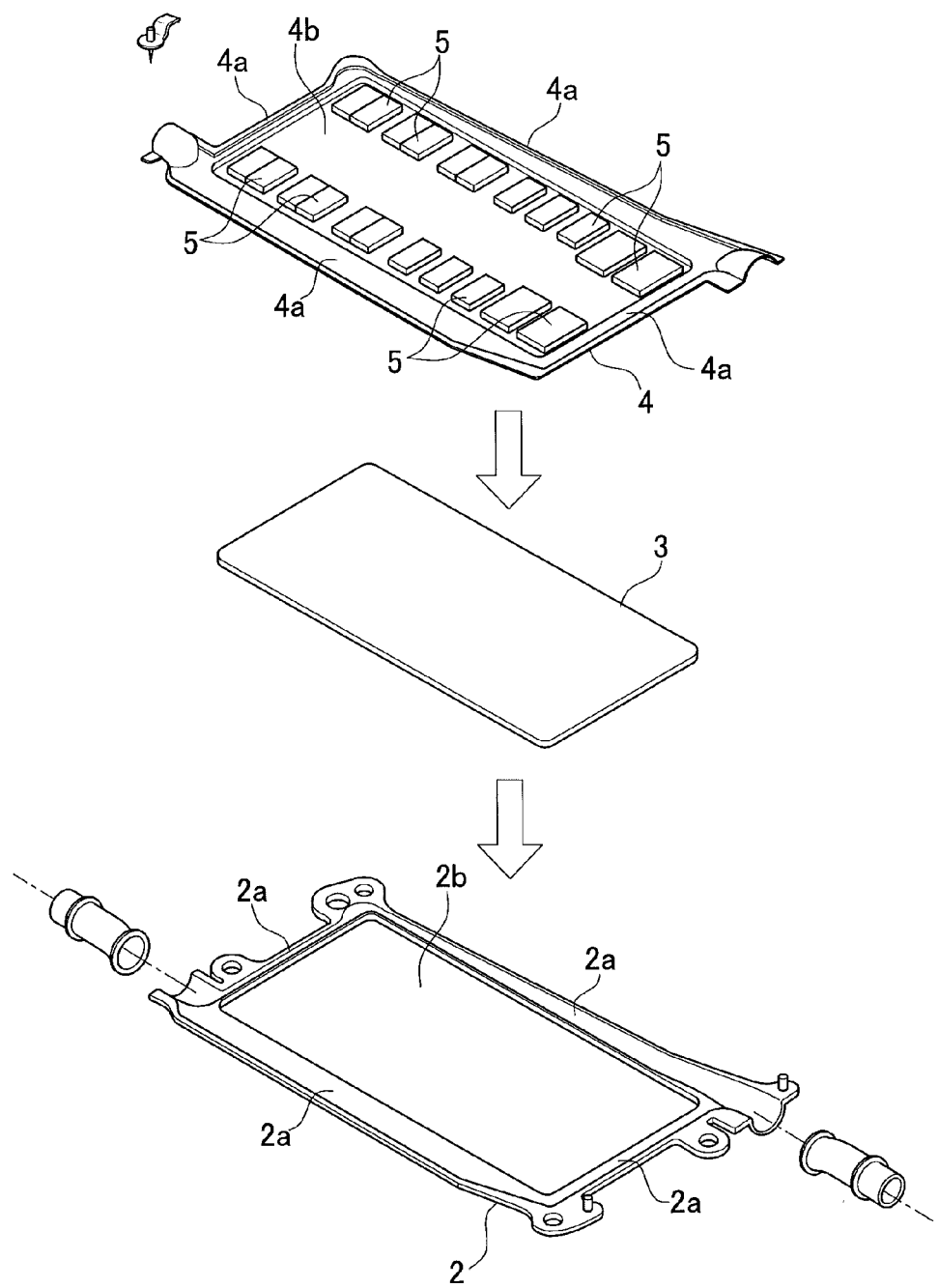
FIG. 9 is a perspective view showing a process of arranging a cooling fin, the top plate, and others to a case in the first embodiment.

Next, as indicated in (2) of FIG. 5, the top plate 4 provisionally fixed with the insulating substrates 5, the cooling fin 3, the case 42, and others are assembled to one another. Specifically, as shown in a perspective view of FIG. 9, the cooling fin 3 is placed on a recessed part 2b of the case 2, the top plate 4 is placed on the cooling fin 3, and so on. At this time, for bonding the flange 2a of the case 2 and the flange 4a of the top plate 4 as shown in FIG. 2, the brazing material layer 6 having a predetermined thickness is provided in advance therebetween.

Figure 10:
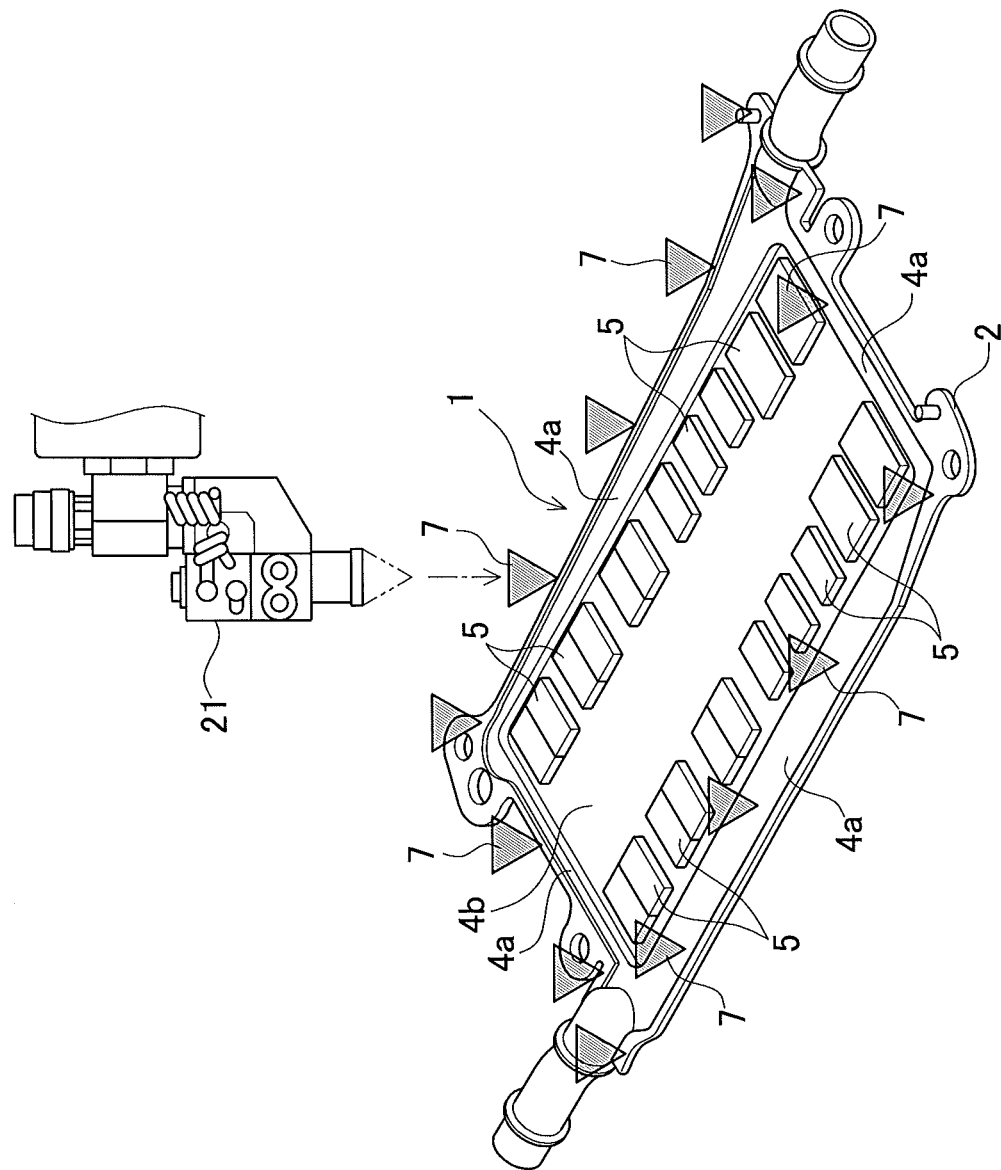
FIG. 10 is a perspective view showing a process of laser-welding the top plate and the case in the first embodiment.

Then, as indicated in (3) of FIG. 5, the top plate 4 is provisionally fixed to the case 2 by laser welding. Specifically, as shown in a perspective view of FIG. 10, at a plurality of points on the flange 4a of the top plate 4, laser welding is carried out by the fiber laser device 21, for example. In the present embodiment, as similar to the above, the laser beam is irradiated on a single point by plural pulses by the fiber laser device 21.

Next, as indicated in (4) of FIG. 5, each component is brazed. Precisely, the flange 4a of the top plate 4 is brazed to the flange 2a of the case 2, and each insulating substrate 5 is brazed to the top plate 4. Herein, the case 2, the cooling fin 3, the top plate 4, and the insulating substrates 5 (an assembly of the cooler 1) which have already been provisionally fixed together are put into a welding furnace so that the flange 4a of the top plate 4 and the flange 2a of the case 2 are brazed to each other and each insulating substrate 5 and the top plate 4 are brazed to each other. Thus, the brazed cooler 1 as shown in FIGS. 1 and 3 is obtained.

Then, as indicated in (5) of FIG. 5, a semiconductor element as a heat generating element is fixed on each insulating substrate 5. Namely, as indicated with a double-chain line in the sectional view of FIG. 4, the power semiconductor 9 is fixed on the insulating substrate 5.

Figure 11:
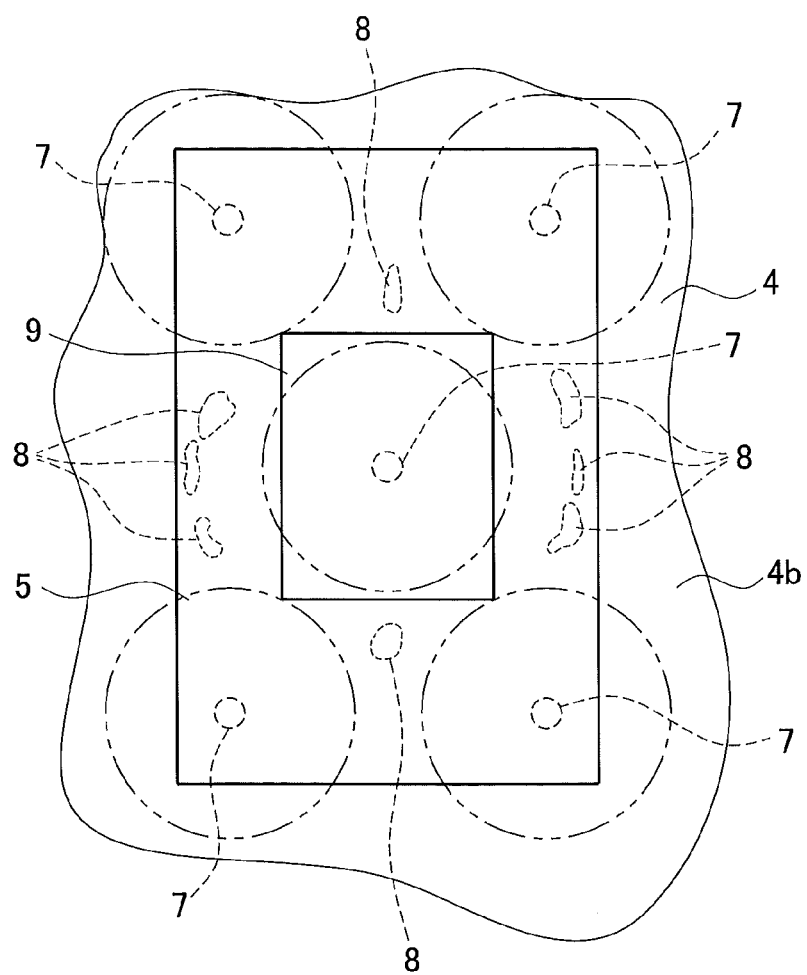
FIG. 11 is a plan view showing the insulating substrate bonded onto the top plate and power semiconductors bonded onto the insulating substrate in the first embodiment.

In the present embodiment, after brazing each component in FIG. 5 (4), the power semiconductor 9 as the heat generating element is bonded and fixed on the insulating substrate 5 as corresponding to a central part of a region surrounded by a plurality of brazing start points. To be more specific, in the present embodiment, as shown in FIG. 11, five welded marks 7 by laser welding remain in the brazing material layer between the recessed part 4b of the top plate 4 and the insulating substrate 5 at points corresponding to each vertex and an intersection point of diagonal lines of the insulating substrate 5 of a rectangular shape in plan view. Then, the power semiconductor 9 is bonded on the insulating substrate 5 in a position within a region surrounded by the four welded marks 7 corresponding to each vertex and above another welded mark 7 included in a central part of the region.

In the above-mentioned brazing method of the present embodiment, when the top plate 4 and the insulating substrates 5 configuring the cooler 1 of the HV inverter are to be brazed, the plurality of insulating substrates 5 are arranged on the recessed part 4b of the top plate 4 via the brazing material layer 6, and then laser welding is carried out by laser irradiation on arbitrary plural points of the bonded part between the top plate 4 and each insulating substrate 5 to provisionally fix each insulating substrate 5 to the top plate 4. After that, the brazing material layer 6 is heated and melted to braze each insulating substrate 5 on the top plate 4 with the plurality of laser welded points as brazing start points.

Further, after brazing, the power semiconductor 9 as the heat generating element is bonded on the insulating substrate 5 in a position within the region surrounded by the four brazing start points and above another brazing start point included in the central part of the region.

According to the above-explained brazing method of the present embodiment, as shown in FIG. 11, the insulating substrate 5 is brazed on the top plate 4 with the four laser welded points (welded marks 7) as the brazing start points, and thereby the positions of voids 8 to be generated in the brazing material layer 6 can be controlled by arbitrarily setting a location of the brazing start points, i.e., the laser irradiation points. Assuming drawing circles centering on each of the adjacent two brazing start points (welded marks 7) such that each circle has a radius equal to a half length of a distance between the two start points, the voids 8 tend to be generated with concentration on portions where the circles are not overlapped. Therefore, by determining the location of the brazing start points as the present embodiment, the generating portions of the voids 8 can be controlled without being dispersed. Accordingly, in relation to brazing of the top plate 4 and each insulating substrate 5 configuring the cooler 1, the bonding efficiency of the top plate 4 and the insulating substrates 5 can be stabilized and improved by controlling the generating portions of the voids 8. In other words, since the voids 8 concentrate on the portion where the circles are not overlapped when drawing the circles centering on the adjacent two brazing start points (welded marks 7) such that each circle has a radius equal to a half length of a distance between the two start points, the bonding efficiency of the top plate 4 and each insulating substrate 5 by brazing can be stabilized and improved without the voids 8 being dispersed.

Further, in the present embodiment, the insulating substrate 5 is provisionally fixed to the top plate 4 by laser welding, and therefore the insulating substrate 5 is prevented from being warped due to high temperature in brazing. Accordingly, it is possible to control a clearance between the top plate 4 and the insulating substrate 5.

Figure 12:
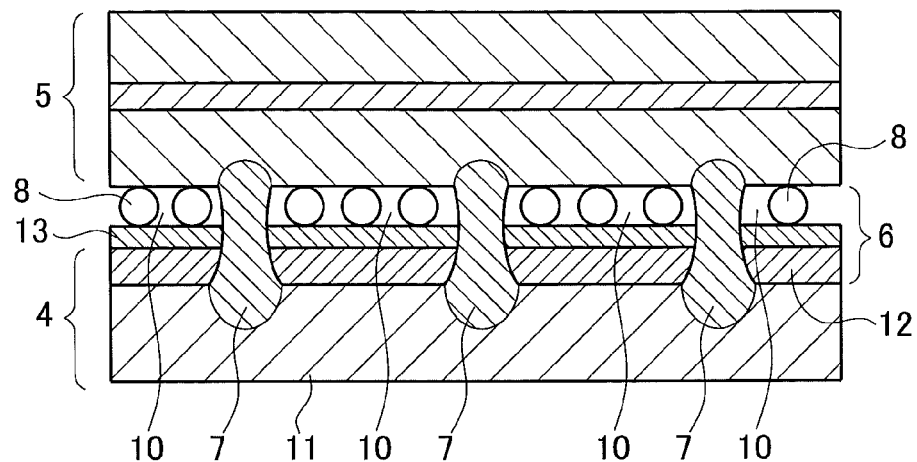
FIG. 12 is a sectional view showing a relationship between the top plate and the insulating substrate before brazing in the first embodiment.
Figure 13:
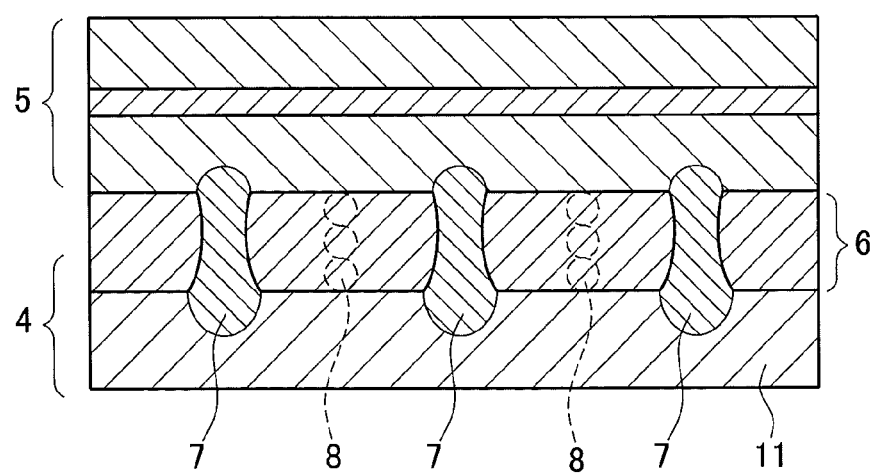
FIG. 13 is a sectional view showing a relationship between the top plate and the insulating substrate after brazing in the first embodiment.

FIG. 12 is a sectional view showing a relationship between the top plate 4 and the insulating substrate 5 before brazing. FIG. 13 is a sectional view showing a relationship between the top plate 4 and the insulating substrate 5 after brazing. As shown in FIG. 12, before brazing, the top plate 4 and the insulating substrate 5 are provisionally bonded via the welded marks 7 by laser welding and the brazing material layer 6. At this time, the plurality of welded marks 7 remain between the top plate 4 and the insulating substrate 5, and the plurality of voids 8 and spaces 10 exist between those welded marks 7. The brazing material layer 6 includes a brazing material 12 integrated with a core member 11 of the top plate 4 and an oxide film 13 formed on the brazing material 12. The voids 8 and the spaces 10 are irregularly dispersed between the oxide film 13 and the insulating substrate 5.

On the other hand, as shown in FIG. 13, after brazing, the top plate 4 and the insulating substrate 5 are fixed via the brazing material layer 6. Between the top plate 4 and the insulating substrate 5, the voids 8 concentratedly exist between the welded marks 7. In the brazing material layer 6, the brazing material 12 integrated with the top plate 4 and the oxide film 13 are fused to be integrated. Further, the brazing material 12 flows starting from the welded marks 7, and the voids 8 concentrate on portions where the circles are not overlapped assuming drawing the circles centering on each of the adjacent two welded marks 7 such that each circle has a radius equal to a half length of the space between the two welded marks 7.

In the present embodiment, as shown in FIG. 11, there are less residual voids 8 in the brazing material layer 6 in portions within the region surrounded by the plurality of brazing start points (welded marks 7) and above another brazing start point (welded mark 7) included in the central part of the region. Accordingly, the power semiconductor 9 is to be bonded on the insulating substrate 5 with avoiding the voids 8. Namely, as shown in FIG. 11, it is now assumed that five welded marks 7 in total are formed as corresponding to four vertexes and an intersection point of diagonal lines of the insulating substrate 5 of a rectangular shape in plan view. In this case, the voids 8 concentrate on the portions where circles are not overlapped when drawing the circles centering on each of the adjacent two welded marks 7 such that each circle has a radius equal to a half length of the space between the two welded marks 7. As a result, the power semiconductor 9 as the heat generating element is fixed on the insulating substrate 5 within the region surrounded by the four welded marks 7 corresponding to each vertex and above another welded mark 7 located in the central part of the region. In this case, the power semiconductor 9 and the voids 8 are hardly overlapped upon one another, and thereby heat radiation from the power semiconductor 9 is less impeded by the voids 8. Accordingly, the power semiconductor 9 can be efficiently cooled, thus improving the function of the cooler 1.

Further in the present embodiment, at least either one of the pulse number and the pulse output of the laser beam is controlled by the fiber laser device 21 for laser irradiation. Thereby, energy density of the laser can be increased, and the laser energy can be supplied to a point to be irradiated on short cycles and with high precision.

According to the brazed structure of the present embodiment, the welded marks 7 by laser welding remain at arbitrary four points in the bonded part between the top plate 4 and the insulating substrate 5 and at the central part of the region surrounded by these four points. Further, the voids 8 remain with concentration in the brazing material layer 6 in the portion where the circles are not overlapped when drawing the circles centering on each of the adjacent two welded marks 7 such that each circle has a radius equal to a half length of the space between the two welded marks 7. Therefore, the voids 8 are less dispersed. Consequently, in relation to brazing of the top plate 4 and each insulating substrate 5 configuring the cooler 1, the bonding efficiency of the top plate 4 and the insulating substrate 5 can be stabilized and improved.

Furthermore, according to the brazed structure of the present embodiment, there are less voids 8 remaining in the portion corresponding to the central part of the region surrounded by the four welded marks 7 in the brazing material layer 6. Accordingly, the power semiconductor 9 is bonded to the insulating substrate 5 with avoiding the voids 8. Therefore, the power semiconductor 9 can be efficiently cooled, thus improving the function of the cooler 1.

Second Embodiment

Next, a second embodiment embodying "a brazing method and a brazed structure" of the present invention applied to a cooler of an HV inverter is explained in detail with reference to the accompanying drawings.

In the above-mentioned first embodiment, laser welding is carried out at the points corresponding to each vertex and the intersection point of diagonal lines of the insulating substrate 5 of a rectangular shape in plan view. In other words, the location of the welded marks 7 by laser welding is determined. On the other hand, the present embodiment is different from the first embodiment in that the welded mark 7 corresponding to the above-mentioned intersection point of diagonal lines is omitted.

Figure 14:
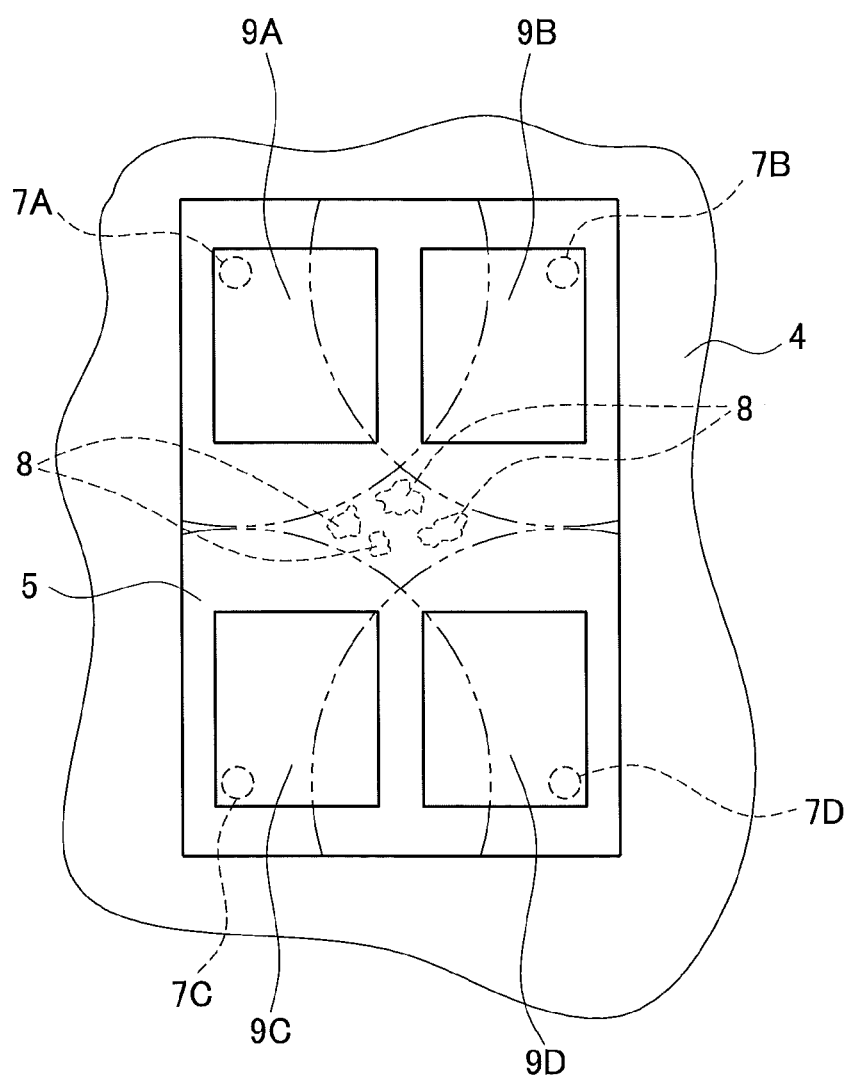
FIG. 14 is a plan view showing an insulating substrate bonded onto a top plate and power semiconductors bonded onto the insulating substrate in a second embodiment.

To be specific, in the present embodiment, in the "brazing method," laser welding is carried out at points corresponding to each vertex of an insulating substrate 5 of a rectangular shape in plan view as shown in FIG. 14 for provisionally fixing a plurality of insulating substrates 5 to a top plate 4 by laser welding. Thereby, four welded marks 7A, 7B, 7C, and 7D in total are formed between a recessed part 4b of the top plate 4 and the insulating substrate 5.

Then, after brazing, four power semiconductors 9A, 9B, 9C, and 9D are bonded on the insulating substrate 5 in positions each displaced from a central part of a region surrounded by four brazing start points (the welded marks 7A to 7D) toward one of the four brazing start points so that the semiconductors 9A to 9D are overlapped with the surrounded region.

In this case, assuming drawing circles centering on each of the four brazing start points (welded marks 7A to 7D) such that each circle has a radius equal to a half length of a distance between the two brazing start points (for example, the welded marks 7A and 7C), the voids 8 tend to be generated with concentration on a portion where the circles are not overlapped (namely, on a central part surrounded by the four brazing start points). Therefore, the four power semiconductors 9A to 9D are bonded on the insulating substrate 5 in positions each displaced from the central part of the region surrounded by the four welded marks 7A to 7D toward each welded mark 7A to 7D so that the semiconductors 9A to 9D are overlapped with the surrounded region.

As a result, there are less voids 8 remaining in the positions displaced from the central part of the region surrounded by the four welded marks 7A to 7D toward each welded mark 7A to 7D in the brazing material layer 6 overlapped with the surrounded region. Accordingly, each power semiconductor 9A to 9D is bonded on the insulating substrate 5 with avoiding the voids 8. Therefore, each power semiconductor 9A to 9D and the voids 8 are hardly overlapped upon one another, so that heat radiation from each power semiconductor 9A to 9D is less impeded by the voids 8. Thereby, each power semiconductor 9A to 9D can be efficiently cooled, thus improving a function of the cooler 1.

The present invention is not limited to the above-mentioned each embodiment and may be embodied by appropriately modifying a part of the configuration without departing from the scope of the invention.

For example, the present invention is applied to brazing the case 2 and the top plate 4 configuring the cooler 1 in the above-mentioned embodiments. Alternatively, the invention may be embodied in brazing a case and a cooling fin.

Figure 15:
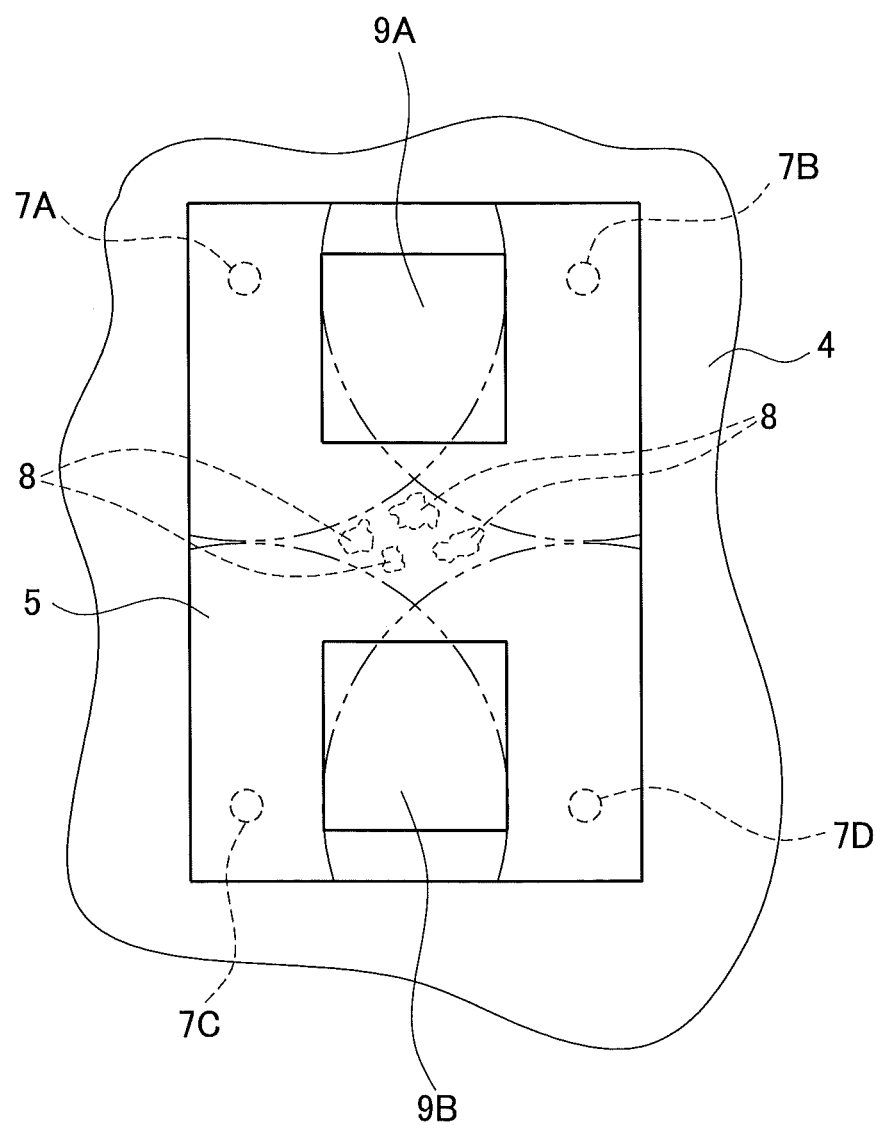
FIG. 15 is a plan view showing an insulating substrate bonded onto a top plate and power semiconductors bonded onto the insulating substrate in another embodiment.

In the second embodiment, as shown in FIG. 14, the four power semiconductors 9A to 9D are bonded on the insulating substrate 5 in the positions displaced from the central part of the region surrounded by the four welded marks 7A to 7D toward each welded mark 7A to 7D so that the semiconductors 9A to 9D are overlapped with the surrounded region. Alternatively, as shown in FIG. 15, two power semiconductors 9A and 9B may be bonded on the insulating substrate 5 in positions displaced from the central part of the region surrounded by the four welded marks 7A to 7D toward between the adjacent two brazing start points (welded marks 7A and 7B or welded marks 7C and 7D) among the four brazing start points so that the semiconductors 9A and 9B are overlapped with the surrounded region.

INDUSTRIAL APPLICABILITY

The present invention can be applied to a cooler of an HV inverter.

REFERENCE SIGNS LIST

1 Cooler
4 Top plate (First element)
5 Insulating substrate (Second element)
6 Brazing material layer
7 Welded mark
7A to 7D Welded mark
8 Void
9 Power semiconductor (Heat generating element)
9A to 9D Power semiconductor (Heat generating element)

The invention claimed is:

1. A method for brazing a first member and a second member configuring a cooler of an HV inverter, wherein the method includes the steps of:
   placing the second member on the first member via a brazing material layer;
   subsequently, irradiating a laser beam for laser welding at arbitrary plural points of a bonded part between the first member and the second member to provisionally fix the second member to the first member; and
   thereafter, heating and melting the brazing material layer to braze the second member on the first member with a plurality of laser welded points as brazing start points,
   wherein after brazing, a heat generating element is bonded on the second member surrounded by a plurality of brazing start points, the heat generating element is centered above another of said brazing start point, wherein a substantially circular region centered on said another of said brazing start point has a radius equal to half a length of distance between the other brazing start point and one of the plurality of brazing start points.

2. A method for brazing a first member and a second member configuring a cooler of an HV inverter, wherein the method includes the steps of:
   placing the second member on the first member via a brazing material layer;
   subsequently, irradiating a laser beam for laser welding at arbitrary plural points of a bonded part between the first member and the second member to provisionally fix the second member to the first member; and
   thereafter, heating and melting the brazing material layer to braze the second member on the first member with a plurality of laser welded points as brazing start points,
   wherein, after brazing, at least a heat generating element is bonded on the second member in a position displaced from a central part of a region surrounded by the plurality of brazing start points toward individual brazing start points or toward between two adjacent two brazing start points of the plurality of brazing start points so that essentially circular regions centered on each of said plurality of brazing start points, and each region having radius equal to half a length of distance between adjacent brazing start points, overlap each of said heat generating elements.

* * * * *